(12) United States Patent
Ledyaev et al.

(10) Patent No.: US 7,740,823 B2
(45) Date of Patent: Jun. 22, 2010

(54) METHOD OF GROWING III GROUP NITRIDE SINGLE CRYSTAL AND III GROUP NITRIDE SINGLE CRYSTAL MANUFACTURED BY USING THE SAME

(75) Inventors: Oleg Ledyaev, Gyunggi-do (KR); Ki Ho Park, Gyunggi-do (KR); Si Hyuk Lee, Gyunggi-do (KR); Soo Min Lee, Seoul (KR)

(73) Assignee: Samsung Electronics Co., Ltd., Gyunggi-Do (KR)

( * ) Notice: Subject to any disclaimer, the term of this patent is extended or adjusted under 35 U.S.C. 154(b) by 239 days.

(21) Appl. No.: 11/976,237

(22) Filed: Oct. 23, 2007

(65) Prior Publication Data

US 2008/0152570 A1 Jun. 26, 2008

(30) Foreign Application Priority Data

Dec. 21, 2006 (KR) .................... 10-2006-0132104

(51) Int. Cl.
*C01B 21/06* (2006.01)

(52) U.S. Cl. .................. 423/409; 423/412; 427/255.11; 427/255.15

(58) Field of Classification Search ................. 423/409, 423/412; 427/255.11, 255.15
See application file for complete search history.

(56) References Cited

U.S. PATENT DOCUMENTS

| 6,824,610 | B2 * | 11/2004 | Shibata et al. ................. 117/89 |
| 2003/0198837 | A1 | 10/2003 | Craven et al. |
| 2006/0091500 | A1 | 5/2006 | Lee et al. |

FOREIGN PATENT DOCUMENTS

| JP | 2006-232640 | 9/2006 |
| KR | 10-2005-0006162 | 1/2005 |
| KR | 10-2006-0038058 | 5/2006 |
| WO | WO 03/089694 A1 | 10/2003 |

OTHER PUBLICATIONS

Korean Office Action, with English translation, issued in Korean Patent Application No. KR 10-2006-0132104, mailed Dec. 13, 2008.

* cited by examiner

*Primary Examiner*—Stuart Hendrickson
*Assistant Examiner*—Michelle Hou
(74) *Attorney, Agent, or Firm*—McDermott Will & Emery LLP

(57) ABSTRACT

A method of growing a III group nitride single crystal by using a metal-organic chemical vapor deposition (MOCVD) process, the method including: preparing an r-plane (1-102) substrate; forming a nitride-based nucleation layer on the substrate; and growing a nonpolar a-plane nitride gallium single crystal on the nitride-based nucleation layer while altering increase and decrease of a ratio of V/III group to alternate a horizontal growth mode and a vertical growth mode.

9 Claims, 4 Drawing Sheets

METHOD OF GROWING III GROUP NITRIDE SINGLE CRYSTAL AND III GROUP NITRIDE SINGLE CRYSTAL MANUFACTURED BY USING THE SAME

CROSS-REFERENCE TO RELATED APPLICATIONS

This application claims the priority of Korean Patent Application No. 2006-0132104 filed on Dec. 21, 2006, in the Korean Intellectual Property Office, the disclosure of which is incorporated herein by reference.

BACKGROUND OF THE INVENTION

1. Field of the Invention

The present invention relates to a method of growing a III group nitride single crystal, and more particularly, to a method of manufacturing an a-plane gallium nitride (GaN) single crystal by using an metal-organic chemical vapor deposition (MOCVD) process.

2. Description of the Related Art

In general, a gallium nitride (GaN) single crystal is grown on a hetero-substrate such as a sapphire $Al_2O_3$ and a silicon carbide SiC by using one of gas-phase growth method such as metal-organic chemical vapor deposition (MOCVD) and hydride vapor phase epitaxy (HVPE) and molecular beam epitaxy (MBE). In an actual method of manufacturing a GaN light emitting device, a GaN single crystal grown in a c-axis direction [0001] of the hetero-substrate is used.

However, since strong piezoelectric properties are shown in the c-axis direction [0001], a piezoelectric field occurs due to a stress on an interface between thin films with different constants. As shown in FIG. 1A, in a band diagram of an ideal active layer without stress, wave functions of electrons and electron holes are approximately symmetrical to each other.

On the other hand, as shown in FIG. 1B, when a compressive stress is applied due to a difference of lattice constant, a distance between wave functions of electrons and electron holes becomes more distant due to the piezoelectric field, as shown as a dotted line.

Accordingly, the active layer of the GaN-based device grown in the c-axis direction of the substrate has a chronic problem of a decrease in recombination efficiency. On the other hand, since the distance between the wave functions due to an effect caused by the piezoelectric field, a light emitting wavelength shows a tendency to be lengthened and a wavelength of the light emitting device may be varied depending on the degree of voltage application.

To solve the problems, U.S. Patent Publication No. 2003/0198837 (published on Oct. 23, 2003, Michael D. Craven et al.) discloses a method of growing nonpolar a-plane GaN. According to the described document, it is disclosed that the nonpolar a-plane GaN is grown only at a low pressure of 0.2 atm or less. The low-pressure growth condition has a limitation on obtaining high quality crystallinity, which is well-known to those skilled in the art. Actually, it may be known that the a-plane GaN disclosed in the document has a plurality of pits in the shape of a stripe pattern.

As described above, in conventional methods of growing an a-plane GaN, there is a limitation on obtaining a mirror-like surface having high quality surface morphology.

To solve the problem, a combination with additional crystal-improvement process such as lateral epitaxial overgrowth (LEO) has been tried. However, in the growth method, not only an additional process is required but also a use area and a size of a device are limited.

SUMMARY OF THE INVENTION

An aspect of the present invention provides a method of growing a nonpolar a-plane nitride single crystal having a excellent surface roughness and a reduced pit in the shape of a stripe pattern.

According to an aspect of the present invention, there is provided a method of growing a III group nitride single crystal by using a metal-organic chemical vapor deposition (MOCVD) process, the method including: preparing an r-plane (1-102) substrate; forming a nitride-based nucleation layer on the substrate; and growing a nonpolar a-plane (11-20) gallium nitride single crystal on the nitride-based nucleation layer while altering increase and decrease of a ratio of V/III group to alternate a horizontal growth mode and a vertical growth mode.

Between the preparing an r-plane (1-102) substrate and the forming a nitride-based nucleation layer thermally processing the substrate may be further included. In this case, the thermally processing the substrate is performed at a temperature of 1000 to 1200° C.

The forming a nitride-based nucleation layer may be performed at a temperature of 500 to 600° C. A thickness of the nitride-based nucleation layer may be 20 to 50 nm.

In the growing a nonpolar a-plane (11-20) nitride gallium single crystal, repeated altering the ratio of V/III group may be performed in such a way that the ratio of V/III group of the vertical growth mode is within a range of 1300 to 1900, and the ratio of V/III group of the horizontal growth mode is within a range of 130 to 190.

The altering increase and decrease of a ratio of V/III group may be performed 10 times or more at an interval of 15 to 60 seconds. A time ratio of the horizontal growth mode to the vertical growth mode may be within a range of 1 to 1.5.

The altering increase and decrease of a ratio of V/III group may be performed by increasing and decreasing a flux of a nitrogen source gas.

According to another aspect of the present invention, there is provided a III group nitride-based single crystal manufactured by using the described method. The III group nitride-base single crystal may have a surface roughness with root mean square of 2.5 nm or less.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
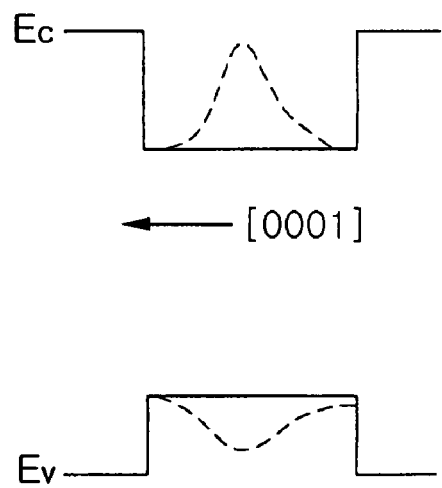
FIGS. 1A and 1B are graphs illustrating an energy band diagram and wave functions of electrons and electron holes of an active layer to describe effects caused by a piezoelectric field.
Figure 1B:
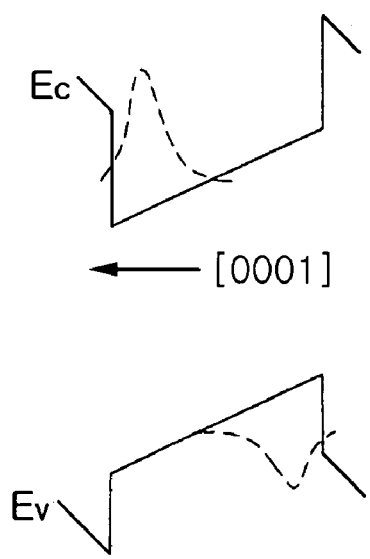
Figure 2:
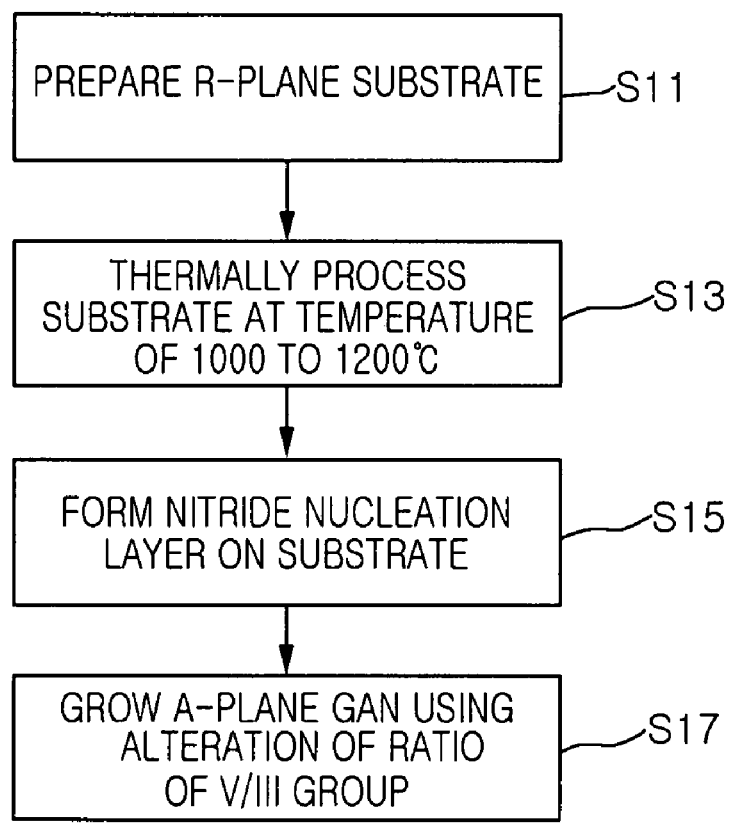
FIG. 2 is a flowchart illustrating a method of growing a III group nitride single crystal according to an exemplary embodiment of the present invention.

FIG. 2 is a flowchart illustrating a method of growing a III group nitride single crystal according to an exemplary embodiment of the present invention.

Referring to FIG. 2, the method of growing a III group nitride single crystal begins with preparing an r-plane (1-102) substrate (S11).

The r-plane substrate for the nitride growth is disposed in a metal-organic chemical vapor deposition (MOCVD) chamber.

Generally, the r-plane substrate for the nitride growth may be an r-plane sapphire substrate, but not limited thereto. In addition, the r-plane substrate may be one of a hetero-substrate for nitride growth, with different Wurzeit structures such as SiC and ZnO and a homo-substrate such as a GaN substrate.

In addition, the substrate is thermally processed (S13).

The present thermal process may clean the substrate before a crystal growth and improve microstructure properties of a crystal face. In this case, the thermal process may be performed at a temperature within a range of 1000 to 1200° C. and may be performed in a reaction chamber for growth.

Next, in S15, a nitride-based nucleation layer is formed on the substrate to grow GaN with high quality.

The nitride-based nucleation layer may be a nitride such as AlN and GaN. The nitride-based nucleation layer may be grown at a temperature within a range of approximately 500 to 600° C. The nitride-based nucleation layer may have a thickness of 20 to 50 nm.

Next, in S17, a nonpolar a-plane (11-20) GaN single crystal is grown on the nitride-based nucleation layer by repeatedly altering increase and decrease of a ratio of V/III group. The nonpolar a-plane GaN single crystal grown at a high temperature is cooled at a normal temperature.

The high growth process may be performed at a high temperature of 1000° C. or more. The repeated alteration of the ratio of V/III group is embodied by an alteration of a growth mode, that is, repeatedly alternating a horizontal growth mode and a vertical growth mode. In this case, a ratio of V/III group of the vertical growth mode may be within a range of 1300 to 1900 and a ratio of V/III group of the horizontal growth mode may be within a range of 130 to 190. According to the repeated alteration of the ratio of V/III group, a nonpolar a-plan nitride may be preferentially grown in a condition of a high ratio of V/III group, and an improvement of crystallinity may preferentially occur in a condition of a low ratio of V/III group.

The repeated alteration of the ratio of V/III group may be easily performed by increasing and decreasing a flux of nitrogen source gas such as $NH_3$. A desirable condition for the repeated alteration of V/III group will be described with reference to FIG. 3.

As described above, a surface roughness of a nonpolar a-plane (11-20) GaN may be greatly improved to be 2.5 nm or less by root means square (RMS) by performing the repeated alteration of the ratio of V/III group.

Figure 3:
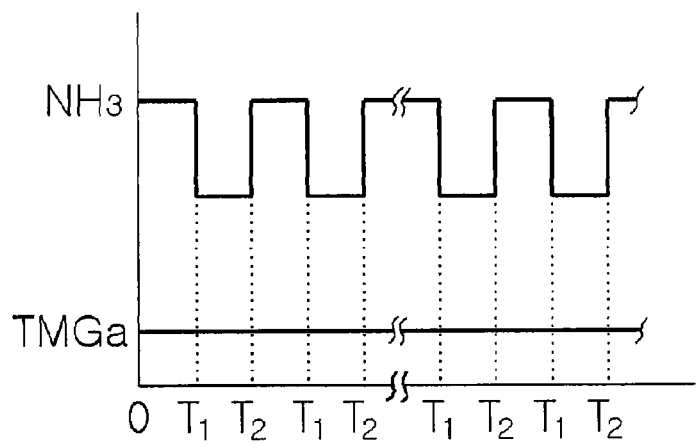
FIG. 3 is a timing chart illustrating an example of a source flux condition according to the method of growing a III group nitride single crystal according to an exemplary embodiment of the present invention.

FIG. 3 is a timing chart illustrating an example of a desirable source flux condition for the repeated alteration of the ratio of V/III group according to an exemplary embodiment of the present invention.

The timing chart illustrates a process of growing nonpolar a-plane GaN, in which trimethyl gallium (TMGa) is used as a Ga source and $NH_3$ is used as a nitrogen source gas.

As described above, the repeated alteration of the ratio of V/III group may be easily performed by increasing and decreasing a flux of the nitrogen source gas such as $NH_3$ in a state of uniformly maintaining other III group source gas. A ratio of V/III group in a vertical growth mode may be controlled to be within a range of 1300 to 1900, and a ratio of V/III group in a horizontal growth mode may be controlled to be within a range of 130 to 190.

As shown in FIG. 3, nonpolar a-plane GaN is grown by supplying a nitrogen source gas $NH_3$ to have a high ratio of V/III group in a condition of supplying uniform TMGa in a period of 0 to $T_1$. Next, in a period of $T_1$ to $T_2$, a growth mode is changed by reducing a flux of $NH_3$. In this case, the flux of $NH_3$ may be reduced to about 6 to 15% of a previous period, and more particularly, may be reduced to be about 10% thereof.

In a period $T_2$ to $T_1$, the flux of $NH_3$ is increased to have a high ratio of V/III group. In this period, the flux of $NH_3$ may be identical to that of the period of 0 to $T_1$.

As described above, an alteration of the ratio of V/III group, which controls the flux of $NH_3$, may be repeatedly performed. When it is considered that the period of one of 0 to $T_1$ and $T_2$ to $T_1$ and the period of $T_1$ to $T_2$ is one cycle, to obtain a satisfactory effect, the one cycle may be repeatedly performed 10 times or more. Also, the period of one of 0 to $T_1$ and $T_2$ to $T_1$ and the period of $T_1$ to $T_2$ may be performed within a range of 15 to 60 seconds, respectively. In this case, a time rate of the period of $T_1$ to $T_2$ with respect to the period of one of 0 to $T_1$ and $T_2$ to $T_1$ may be within a range of 1 to 1.5.

Hereinafter, the operations and effects of the present invention will be described in detail with reference to a detailed embodiment.

Embodiment

The present embodiment was performed to set a proper range of a III group Ga source supply amount to obtain nonpolar a-plane GaN with excellent crystallinity.

An r-plane (1-102) sapphire substrate was disposed in an MOCVD chamber and was thermally processed at a temperature of 1100° C. in a hydrogen atmosphere. A low temperature nitride-based nucleation layer is grown at a temperature of 550° C. to a thickness of about 30 nm.

Next, a process of growing GaN is performed at a temperature of about 1100° C. using the described repeated alteration of the ratio of V/III group. That is, with a state of setting a supply amount of TMGa that is a Ga source as 35 μmol/min, nonpolar a-plane GaN is grown by supplying $NH_3$ that is a nitrogen source gas set by 540000 μmol/min for about 30 seconds (V/III group ratio=1800), and $NH_3$ is supplied for 35 seconds by 54000 μmol/min (V/III group ratio=180). After that, nonpolar a-plane GaN having a 3.5 μm is grown by repeatedly performing one cycle 20 times by using a way of increasing $NH_3$ to 540000 μmol/min.

To analyze crystallographic properties of GaN obtained via the present embodiment, an X-ray diffraction (XRD) is performed.

Figure 4A:
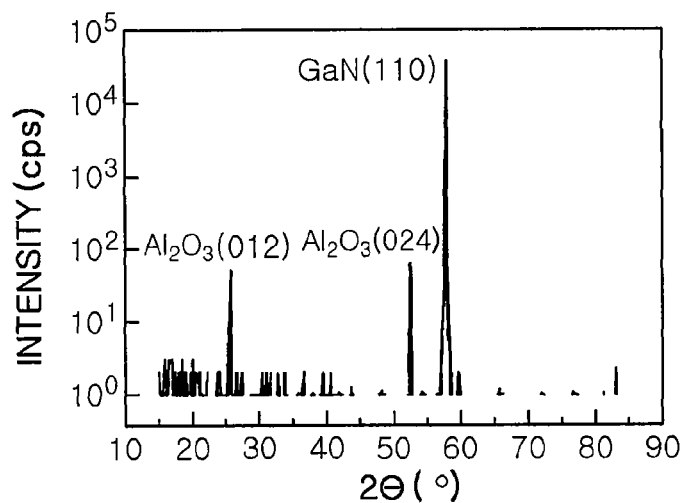
FIGS. 4A and 4B are graphs illustrating results of θ-2θ diffraction scan and (11-20)ω diffraction scan of gallium nitride (GaN) obtained according to an exemplary embodiment of the present invention, respectively.

FIG. 4A is a graph illustrating a θ-2θ diffraction scan result of GaN obtained according to the present embodiment.

As shown in FIG. 4A, as a result of diffraction scan for a growth surface of GaN, a peak 0001 corresponding to a c-plane is not shown, only a peak 110 corresponding to (11-20) is shown. Accordingly, it may be known that GaN obtained in the present embodiment is a-plane (11-20) GaN.

Figure 4B:
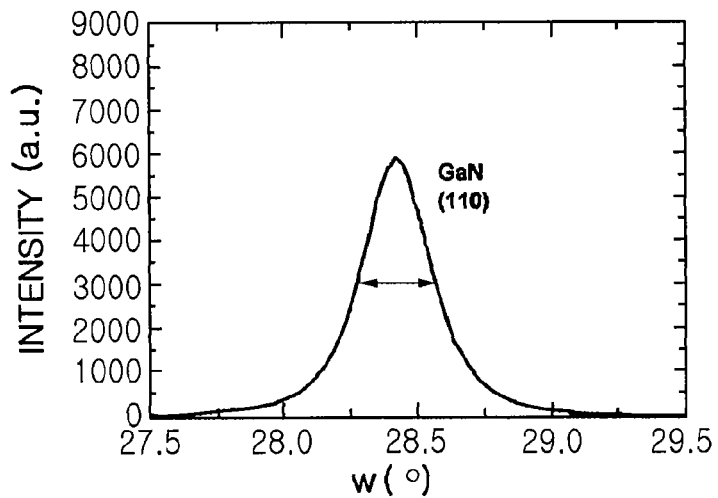

To estimate crystal properties of nonpolar a-plane GaN, a ω locking curve is performed on-axis (11-20) and a result thereof is shown in FIG. 4B. As shown in FIG. 4B, a full width at half maximum (FWHM) of a peak (11-20) is 0.3°, which is relatively excellent crystallinity.

Figure 5:
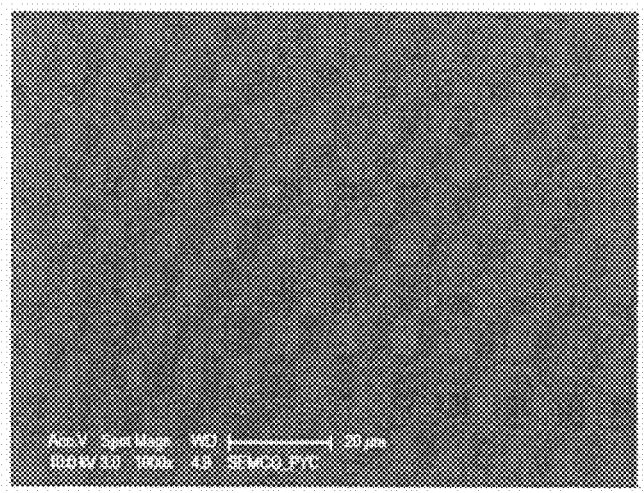
FIG. 5 is a scanning electron micrograph (SEM) of a surface of the GaN obtained in the present embodiment.

FIG. 5 is a scanning electron micrograph (SEM) of a surface of the GaN obtained in the present embodiment. As shown in FIG. 5, it may be known that nonpolar a-plane GaN has a very flat surface and hardly has a pit.

Figure 6A:
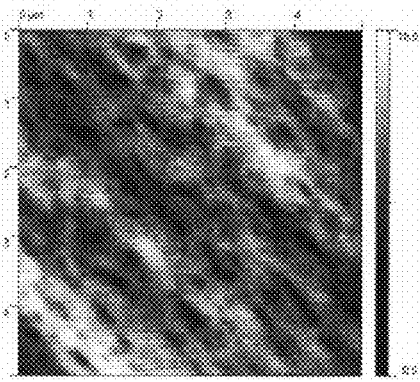
FIGS. 6A and 6B are atomic force microscope (AFM) altitude and amplitude images with respect to the surface of the GaN.
Figure 6B:
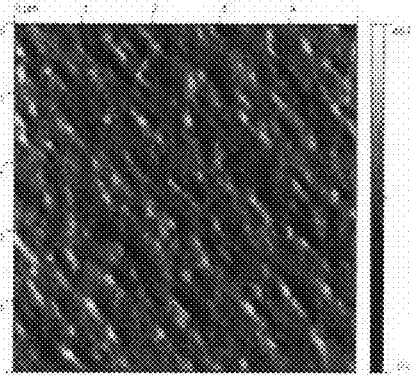

To check a surface morphology in more detail, atomic force microscope (AFM) with respect to an area of 5 μm×5 μm of a surface of GaN obtained in the present embodiment is taken. FIGS. 6A and 6B are atomic force microscope (AFM) altitude and amplitude images with respect to the surface of the GaN.

Referring to FIGS. 6A and 6B, the surface is also shown to be very flat. The surface roughness is very low at a degree of 2.46 nm or less by RMS. Also, it may be known that there is no a large pit in the shape of a stripe pattern on the surface of the nonpolar a-plane GaN.

In the present embodiment, as the substrate, a sapphire substrate is described, which does not define the present invention. For example, substrates for growing GaN such as silicon carbide, GaN, and zinc oxide, which have a similar crystal structure to the sapphire substrate, may be employed.

As described above, according to an aspect of the present invention, there is provided nonpolar a-plane (11-20) GaN having a greatly improved surface roughness and excellent crystallinity with a notably reduced number of pits in the shape of a stripe pattern in a low pressure growth condition by repeatedly altering a ratio of V/III group in a high temperature GaN growth process.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of growing a III group nitride single crystal by using a metal-organic chemical vapor deposition (MOCVD) process, the method comprising:
   preparing an r-plane (1-102) substrate;
   forming a nitride-based nucleation layer on the substrate; and
   growing a nonpolar a-plane (11-20) gallium nitride single crystal on the nitride-based nucleation layer while alternately increasing and decreasing a ratio of V/III group to alternate between a horizontal growth mode and a vertical growth mode.

2. The method of claim 1, further comprising thermally processing the substrate, between the preparing an r-plane (1-102) substrate and the forming a nitride-based nucleation layer.

3. The method of claim 2, wherein the thermally processing the substrate is performed at a temperature of 1000 to 1200° C.

4. The method of claim 1, wherein the forming a nitride-based nucleation layer is performed at a temperature of 500 to 600° C.

5. The method of claim 1, wherein a thickness of the nitride-based nucleation layer is 20 to 50 nm.

6. The method of claim 1, wherein the ratio of V/III group of the vertical growth mode is within a range of 1300 to 1900, and the ratio of V/III group of the horizontal growth mode is within a range of 130 to 190.

7. The method of claim 6, wherein, in the growing a nonpolar a-plane nitride gallium single crystal, the alternately increasing and decreasing a ratio of V/III group is performed 10 times or more at an interval of 15 to 60 seconds.

8. The method of claim 7, wherein a time ratio of the horizontal growth mode to the vertical growth mode is within a range of 1 to 1.5.

9. The method of claim 6, wherein the altering increase and decrease of a ratio of V/III group is performed by increasing and decreasing a flux of a nitrogen source gas.

* * * * *